United States Patent [19]
Baltus

[11] Patent Number: 5,999,050
[45] Date of Patent: Dec. 7, 1999

[54] DIFFERENTIAL AMPLIFIER, AN INTEGRATED CIRCUIT, AND A TELEPHONE

[75] Inventor: Petrus G. M. Baltus, Eindhoven, Netherlands

[73] Assignee: U.S. Philips Corporation, New York, N.Y.

[21] Appl. No.: 09/103,456

[22] Filed: Jun. 24, 1998

[30] Foreign Application Priority Data

Jun. 25, 1997 [EP] European Pat. Off. ............. 97201944

[51] Int. Cl.[6] ........................................ H03F 3/45
[52] U.S. Cl. .................... 330/252; 330/254; 330/261
[58] Field of Search .................... 330/252, 254, 330/259, 261

[56] References Cited

U.S. PATENT DOCUMENTS

| | | | |
|---|---|---|---|
| 3,440,554 | 4/1969 | McGraw et al. | 330/30 |
| 4,442,408 | 4/1984 | Le | 330/261 |
| 5,248,945 | 9/1993 | Atkinson | 330/252 |
| 5,287,071 | 2/1994 | Olmstead et al. | 330/258 |

*Primary Examiner*—Robert Pascal
*Assistant Examiner*—Patricia T. Nguyen

[57] ABSTRACT

A differential amplifier comprises differential main current streams, a controlled current source means to feed the main current streams, the controlled current source means having a control input for controlling the main current streams, and a saturation sensing circuit coupled between the main current streams and the control input for generating a control input signal in dependence of saturation sensed in at least one of the main current streams. The differential amplifier has an improved large signal behaviour at low power dissipation and increased efficiency.

13 Claims, 5 Drawing Sheets

DIFFERENTIAL AMPLIFIER, AN INTEGRATED CIRCUIT, AND A TELEPHONE

BACKGROUND OF THE INVENTION

The present invention relates to a differential amplifier outlined in the first part of claim 1.

The present invention also relates to an integrated circuit provided with such a differential amplifier and to a telephone provided with such an integrated circuit.

SUMMARY OF THE INVENTION

Such a differential amplifier is known from U.S. Pat. No. 3,440,554. The known differential amplifier comprises differential main current (ways, paths) hereafter called streams having a two-stage differential transistor pair fet by a controlled current source transistor means having a control input for controlling the main current streams, and comprises a loop circuit embodied as a common mode negative feedback loop coupled between the main current streams and the control input of the controlled current source transistor means. The common mode negative feedback acts to improve the discrimination factor (defined as the ratio of differential mode to common mode gain) and to improve the common mode rejection factor (defined as the common mode voltage input to the differential mode voltage input to produce the same output voltage). In addition a negative feedback bias loop is implemented in the differential main current streams to permit elimination of the collector resistances in said streams. The operation of the known differential amplifier is such that the combination of the common mode negative feedback loop and the negative feedback bias loop results in a cooperative effort to maintain the collector bias voltage constant. It is an disadvantage of the known differential amplifier that the large AC signal behaviour is poor and that only a limited range of input amplitudes can be amplified effectively.

Therefore it is an object of the present invention to provide a differential amplifier having improved large AC signal behaviour and being suitable for being applied in a wider variety of applications.

Thereto the differential amplifier according to the invention has the characterising features outlined in claim 1. The present invention makes use of the notion that the poor large AC signal behaviour of the known differential amplifiers is due to saturation effects originating from large AC output signals whose top amplitude approach the supply voltage, and that this disadvantageous behaviour improves if the controlled current source means is controlled such that during saturation the differential main current provided by said means is temporarily increased to compensate for the saturation effects. The differential circuit according to the invention can now be used in applications where low power dissipation and/or high efficiency are/is required. Apart from low frequencies the differential amplifier according to the invention can, depending on the bandwidth of the applied semiconductors, also be used in RF applications. Special attention deserves application in processes offering excess bandwidth at currents lower than currents required for achieving dynamic range requirements. The excess bandwidth can then be used through the differential amplifier according to the invention to reduce power dissipation and increase efficiency, but also to make the power dissipation adaptive to signal levels that are being processed. This opens further possibilities of the differential amplifier according to the invention for being applied in front-end circuits for mobile radio and mobile telephone applications, viz. GSM and AMPS front-ends. In addition easy integration is possible which will result in improved characteristics because integration leads to better matched applicable semiconductor components in the respective differential main current streams and to small sized appliances.

DESCRIPTION OF THE PREFERRED EMBODIMENTS

One embodiment of the differential circuit according to the invention has the characterising features outlined in claim 2. In this embodiment of the differential amplifier according to the invention such a detecting circuit senses saturation in the main current streams by detecting the maximum voltage which is allowable for a saturation free functioning.

An embodiment which has the advantage of being easily implementable by means of only one type of semiconductors, that is to say either PNP or the more easily to integrate NPN semiconductors, has the characterising features outlined in claim 3.

A further embodiment of the differential amplifier according to the invention has the characterising features outlined in claim 4. Such a bias element which can either be resistive or reactive serves effective gain control purposes for controlling the tail current -which is the combined current in both main current streams- provided by the controlled current source means.

A still further embodiment of the differential amplifier according to the invention has the characterising features outlined in claim 5. The advantage of applying degeneration elements, such as for example resistors in the differential main current stream is that these elements improve linearity around the cross-over point, which otherwise would introduce troublesome third order distortion.

A next embodiment of the differential amplifier according to the invention has the characterising features outlined in claim 6. This embodiment of the differential amplifier according to the invention has the advantage of mainly containing semiconductor elements as bias controlling elements, thus forming an alternative to such bias controlling elements embodied with a bias resistor means.

Still a next embodiment of the differential amplifier according to the invention has the characterising features outlined in claim 7 for providing the advantage of a reduced supply voltage dependency of the functioning of said differential amplifier.

BRIEF DESCRIPTION OF THE DRAWING

The present invention will now be described, by way of example, with reference to the accompanying drawings, wherein In the drawing:

Throughout the figures the same reference numerals are used for the same features.

FIG. 1 shows a differential amplifier 1 comprising differential main current paths or streams, designated A and B, formed by the collector-emitter chains of two controllable semiconductor transistors 2 and 3. A controlled current source means 4 included in the amplifier 1 feeds the main current streams A and B. The controlled current source means 4 showing one current source transistor has a control input 5 for controlling current in the main current streams. The collectors 6 and 7 respectively of transistor 2 and 3 are connected to a supply voltage Vcc, through resistors 8 and 9 and possible common resistor 10. Vcc is also connected to earth as shown. Bases 11 and 12 of the respective transistors 2 and 3 form input terminals for an input signal to be amplified, whereas the amplified signal can be taken from collectors 6 and 7. As shown the main stream currents A, B are being combined at collector 13 of current source transistor 4, whose emitter is also grounded. The functioning of such a differential amplifier is generally known.

Figure 1:
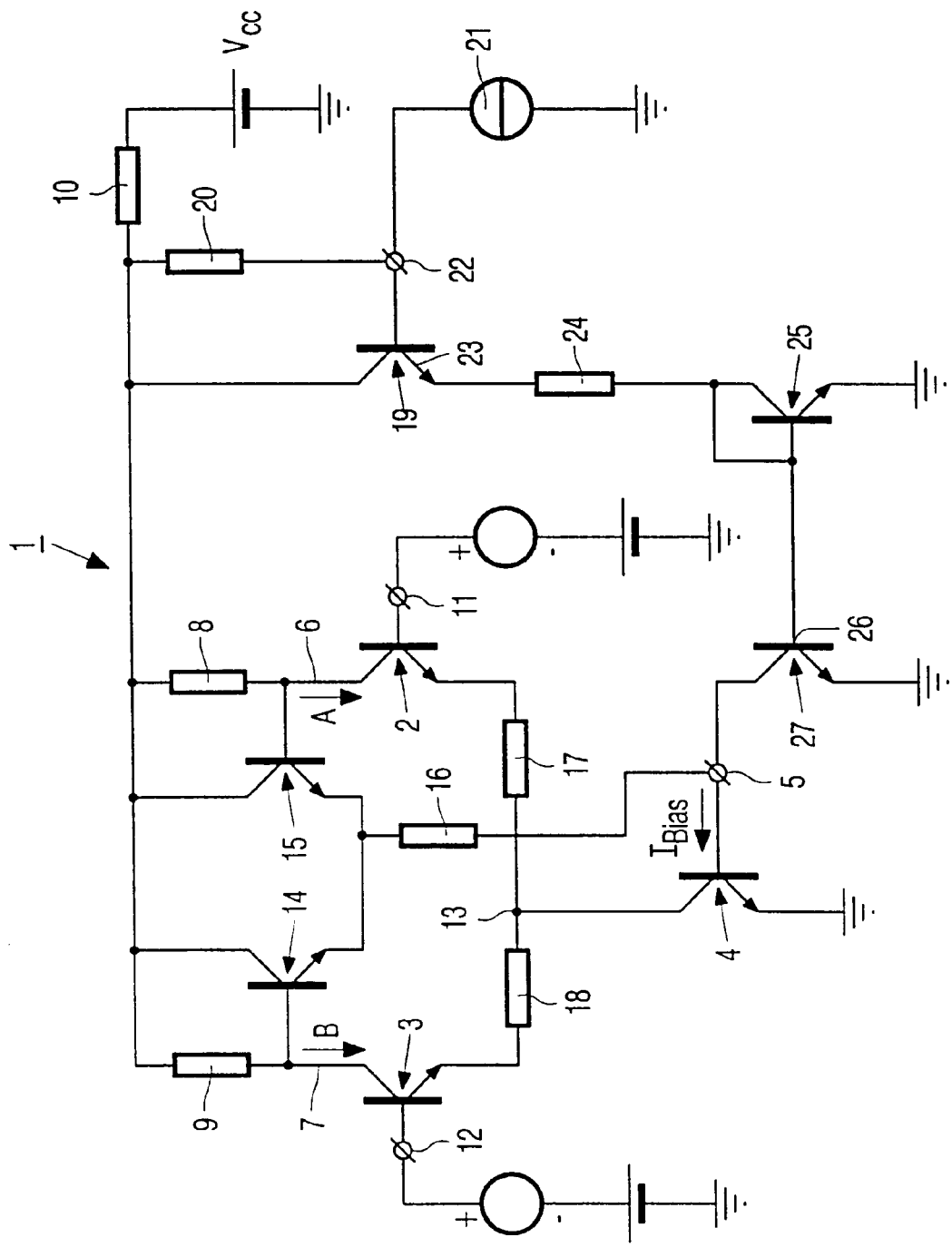
FIG. 1 schematically shows combined embodiments of the differential amplifier according to the invention.

The differential amplifier 1 further comprises a saturation sensing circuit which in the shown embodiment has two semiconductors 14 and 15 whose emitters are mutually connected to a bias element 16, which saturation sensing circuit 14, 15, 16 is coupled between the main current streams A, B and the control input 5 of the controlled current source means 4. The respective bases of the transistors 14, 15 are connected to the collectors 6 and 7, whereas its collectors are mutually coupled to Vcc. The functioning of the saturation sensing circuit 14-16 is such that it senses saturation in at least one of the main current streams A and B. The sensing circuit 14-16 is shown to be embodied as a main current stream maximum voltage detection circuit such that saturation is detected by detecting the maximum voltage on either one of the collectors 6 and 7, which maximum voltage Vce approaches Vcc, thus showing saturation symptoms, elucidated in FIG. 2.

Figure 2:
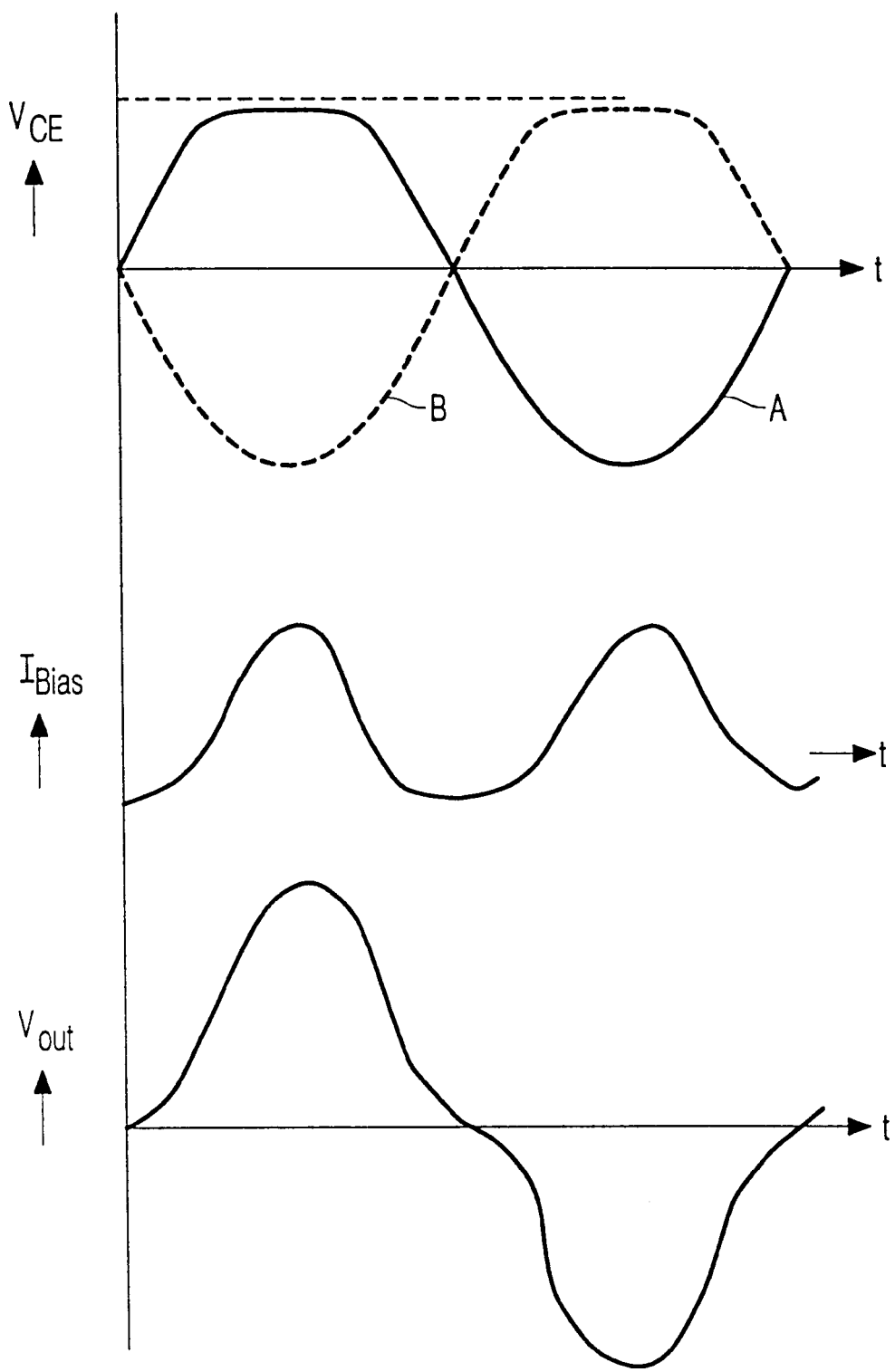
FIG. 2 shows graphs of Vce, Ibias and Vout (=V7-V6) as functions of time (t) respectively appearing in the amplifier of FIG. 1.

The functioning of the sensing circuit 14-16 is such that it generates a increased biasing current Ibias -see FIG. 2- which is controlled by the maximum of the two output voltages on collectors 6, 7. This maximum voltage will occur in the stream containing the lowest current, and therefore the lowest input voltage. The increased biasing current is injected at the control input 5 of current source 4, thus increasing the tail current through current source 4 which increase will essentially only increase the current in that stream A or B, were through the highest current flows. The current in the other stream stays at a more or less constant value higher than zero. The thus further increased higher current stream pulls the corresponding collector output temporarily down during saturation. The result is an amplified differential voltage Vout, shown in FIG. 2, which does not show saturation effects.

Bias element 16, shown to comprise a resistor can simply be used for gain control by controlling the tail current through current source 4. Degeneration elements 17 and 18, comprising resistors, are used to improve linearity around the cross-over point, where conduction of one of the transistors 2, 3 is taken over by the other. This reduces third order harmonic distortion.

The differential amplifier 1 further comprises a ripple supply voltage detecting means having a ripple control output coupled to the control input 5 of the controlled current source means 4. The ripple supply voltage detecting means comprises a transistor 19 connected as an emitter follower with a resistor 20 and a current source 21 connected in series to earth, whose connecting point is connected to the base 22 of transistor 19. Its emitter 23 is connected to earth through a series arrangement of resistor 24 and junction 25. The connecting point of 24 and 25 is connected to the base 26 of transistor 27, whose mirrored main current stream is connected to control input 5.

The functioning of the ripple supply voltage detecting means 19-27 is such that it reduces the bias current dependence on the power supply voltage Vcc, since any change in the supply voltage across the differential amplifier 1 results in a corresponding change in base current to transistor 4, leaving uninfluenced the biasing current through resistor 16.

Figure 3:
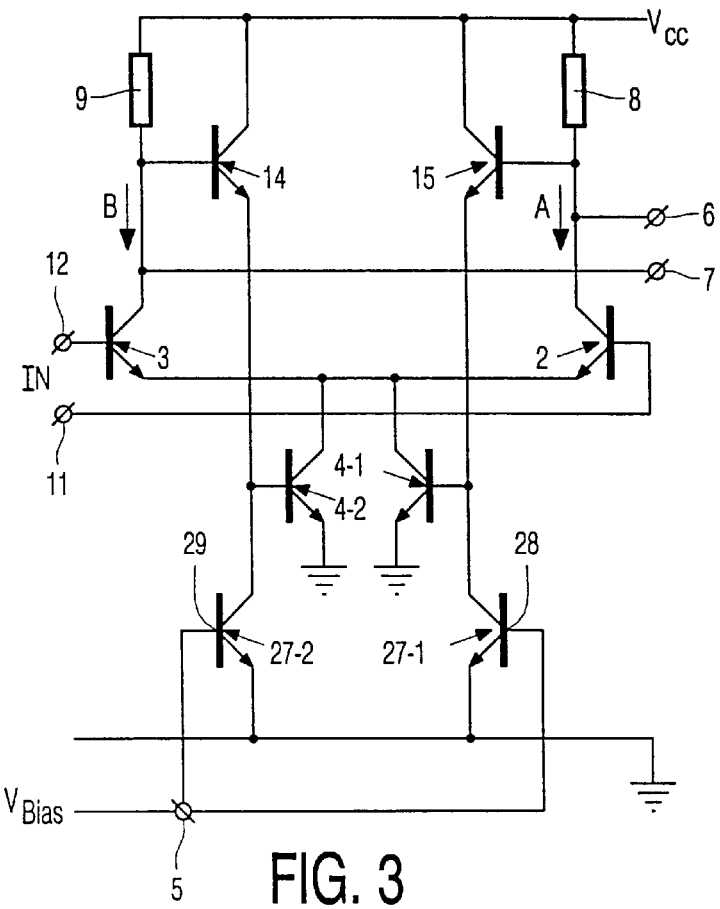
FIG. 3 shows a further embodiment of the differential amplifier according to the invention.

FIG. 3 shows a further embodiment of the differential amplifier according to the invention, wherein the controlled current source means comprises two separate current source semiconductors 4-1 and 4-2, whose respective biasing currents are now voltage controlled by at wish only one Vbias on the interconnected respective bases 28 and 29 of the semiconductors 4-1 and 4-2.

Figure 4:
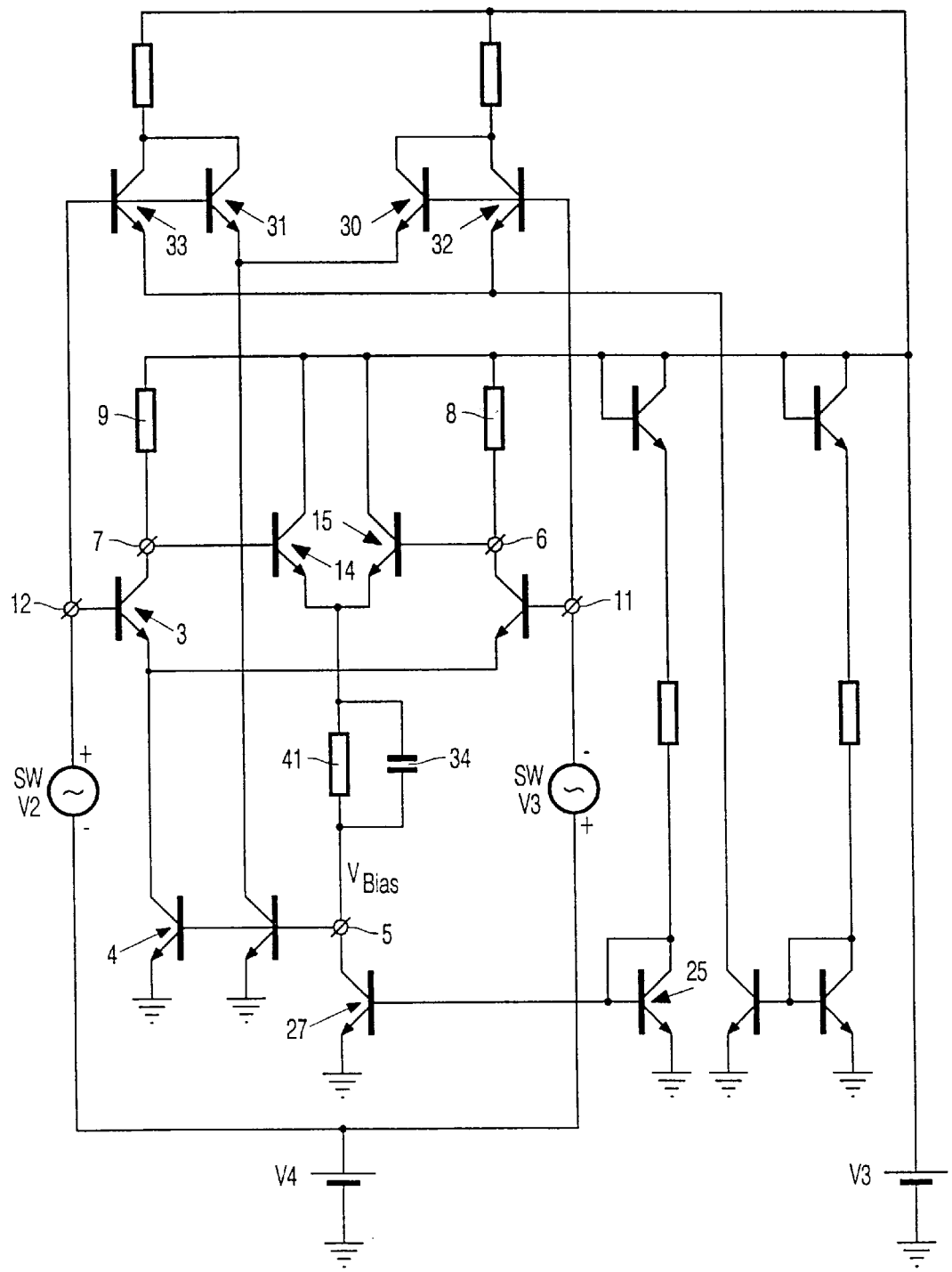
FIG. 4 shows a still further embodiment of the differential amplifier according to the invention.

FIG. 4 shows a further worked out embodiment of the differential amplifier 1. Extra circuitry is added therein to lower the third harmonic distortion with 3 dB. The circuitry essentially comprises two current sources 30 and 31 controlled by parallel input transistors 32 and 33 thus providing additional control to current source 4 for improving linearity at the cross over point mentioned earlier. Bias element 16 now comprises a parallel arrangement of a resistor 41 and a capacitor 34 for improving speed control characteristics.

Figure 5:
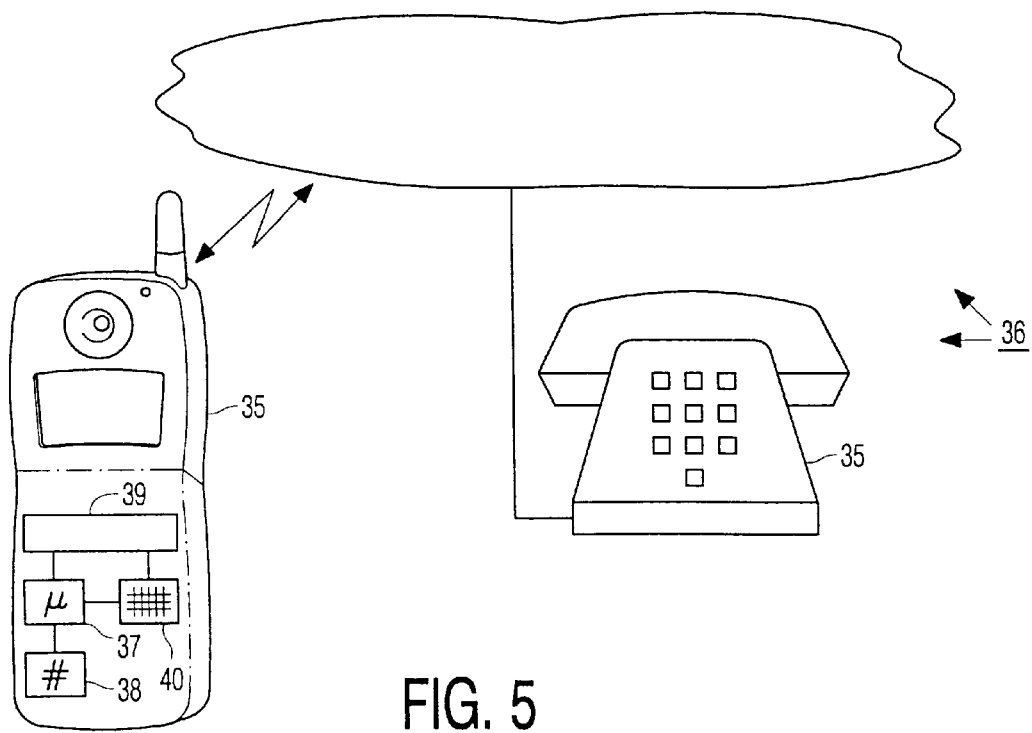
FIG. 5 shows a telecommunication system provided with telephones having integrated circuits including a differential amplifier according to the invention and FIG. 6 shows an embodiment of the differential amplifier according to the invention.

The differential amplifier 1 can be implemented in an IC for application in a telecommunication device such as a telephone 35 as shown in FIG. 5. Such a telephone can be a mobile telephone or a fixed telephone or the like and can be implemented in a telecommunication system 36. It contains a microprocessor 37, an associated memory 38, display screen 39, and a keyboard 40. Of course the telephone 35 will comprise all further features properly implemented and necessary for the required functioning thereof, together with additional features such as hands free capabilities, listening in features, loudspeaker facilities, dialling features, charging facilities etcetera.

Figure 6:
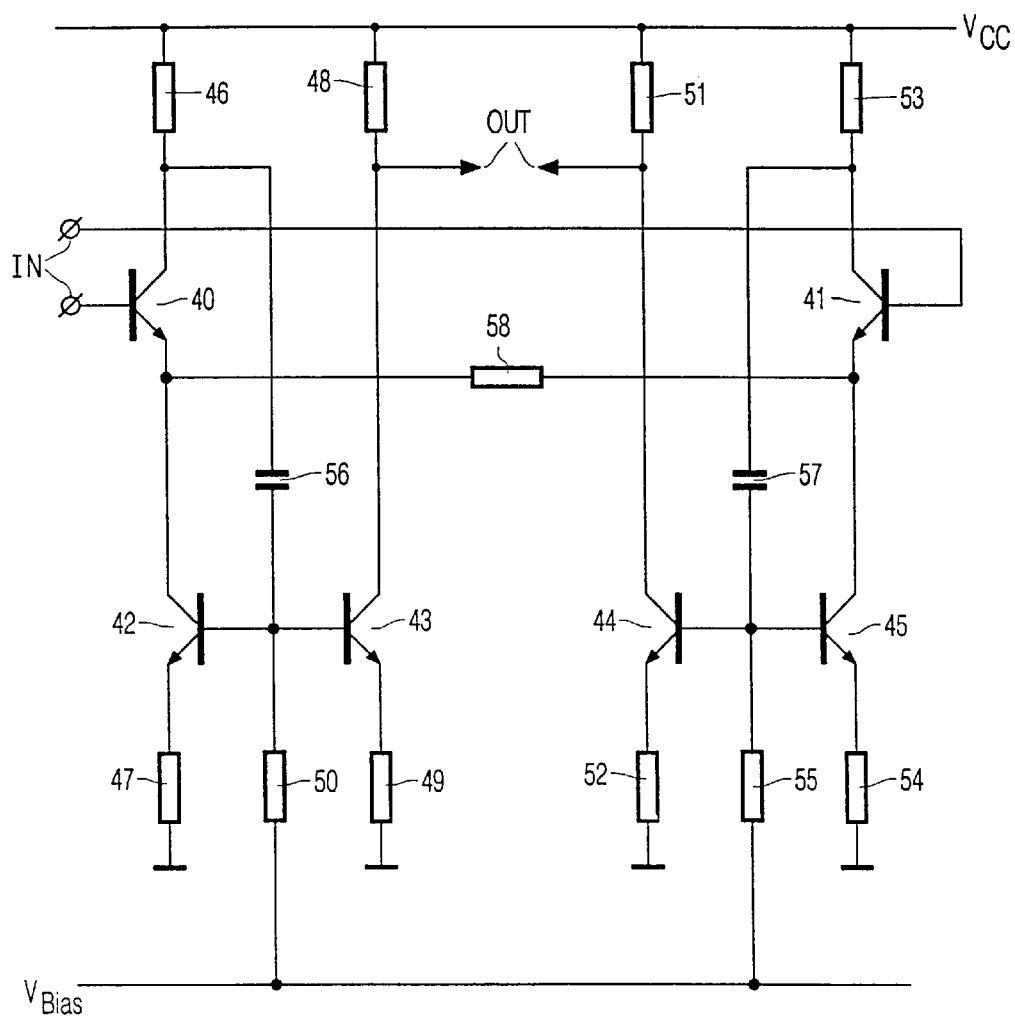

FIG. 6 shows an embodiment of the differential amplifier 1 according to the invention, comprising transistors 40, 41, 42, 43, 44 and 45, and resistors 46, 47, 48, 49, 50, 51, 52, 53, 54 and 55, and further capacitors 56 and 57, and a resistor 58 between emitters of the transistors 40 and 41. This embodiment has similar properties as the other described embodiment, but provides a higher efficiency because of the larger output voltage OUT if sufficient bandwidth is available from the active devices. The resistor 58 sets the gain. The bias voltage VBias sets the limits for the class A region of operation. The output voltage OUT is the largest possible in an NPN-only circuit, a CMOS implementation also being applicable. The capacitors 56 and 57 may be replaced by level shift circuits, well known in the art.

In view of the foregoing it will be evident to a person skilled in the art that various modifications may be made within the spirit and the scope of the present invention as hereinafter defined by the appended claims and the present invention is thus not limited to the examples provided.

I claim:

1. A differential amplifier comprising:
    differential main current streams, each of which is coupled to a respective output terminal of the differential amplifier, a controlled current source means to feed the main current streams, the controlled current source means having a control input for controlling the main current streams, and a maximum voltage detection circuit comprising common collector connected semiconductors, the common collector connected semiconductors being coupled between the output terminals and the control input, and to a supply terminal of the differential amplifier, the maximum voltage detection circuit detecting a maximum voltage at either one of the output terminals, the maximum voltage controlling the controlled current source means such that a voltage at the output terminal coupled to another one of the main current streams temporarily drops during saturation of the differential amplifier.

2. A differential amplifier according to one of the claims 1, wherein the differential amplifier comprises a bias element coupled between the main current streams and the control input of the controlled current source means.

3. A differential amplifier according to one of the claims 1, wherein the differential amplifier comprises degeneration elements included in the differential main current streams.

4. A differential amplifier according to one of the claims 1, wherein the controlled current source means comprises separately controlled current sources each coupled to a respective differential main current stream.

5. A differential amplifier according to one of the claims 1, wherein the differential amplifier comprises ripple supply voltage detecting means having a ripple control output coupled to the control input of the controlled current source means.

6. An integrated circuit provided with a differential amplifier, comprising:

differential main current streams, each of which is coupled to a respective output terminal of the differential amplifier, a controlled current source means to feed the main current streams, the controlled current source means having a control input for controlling the main current streams, and a maximum voltage detection circuit comprising common collector connected semiconductors, the common collector connected semiconductors being coupled between the output terminals and the control input, and to a supply terminal of the differential amplifier, the maximum voltage detection circuit detecting a maximum voltage at either one of the output terminals, the maximum voltage controlling the controlled current source means such that a voltage at the output terminal coupled to another one of the main current streams temporarily drops during saturation of the differential amplifier.

7. A telephone provided with an integrated circuit having a differential amplifier comprising:

differential main current streams, each of which is coupled to a respective output terminal of the differential amplifier, a controlled current source means to feed the main current streams, the controlled current source means having a control input for controlling the main current streams, and a maximum voltage detection circuit comprising common collector connected semiconductors, the common collector connected semiconductors being coupled between the output terminals and the control input, and to a supply terminal of the differential amplifier, the maximum voltage detection circuit detecting a maximum voltage at either one of the output terminals, the maximum voltage controlling the controlled current source means such that a voltage at the output terminal coupled to another one of the main current streams temporarily drops during saturation of the differential amplifier.

8. A differential amplifier according to claim 1 wherein the differential amplifier comprises a bias element coupled between the main current streams and the control input of the controlled current source means; and the differential amplifier degeneration elements included in the differential main current streams.

9. A differential amplifier according to claim 1 wherein the differential amplifier comprises a bias element coupled between the main current streams and the control input of the controlled current source means; and the controlled current source means comprises separately controlled current sources each coupled to a respective differential main current stream.

10. A differential amplifier according to claim 1 wherein the differential amplifier comprises a bias element coupled between the main current streams and the control input of the controlled current source means; and the differential amplifier comprises degeneration elements included in the differential main current streams; and the controlled current source means comprises separately controlled current sources each coupled to a respective differential main current stream.

11. A differential amplifier according to claim 1 wherein the differential amplifier comprises a bias element coupled between the main current streams and the control input of the controlled current source means; and the differential amplifier comprises ripple supply voltage detecting means having a ripple control output coupled to the control input of the controlled current source means.

12. A differential amplifier according to claim 1 wherein the differential amplifier comprises a bias element coupled between the main current streams and the control input of the controlled current source means; and the differential amplifier comprises degeneration elements included in the differential main current streams; and the differential amplifier comprises ripple supply voltage detecting means having a ripple control output coupled to the control input of the controlled current source means.

13. A differential amplifier according to claim 1 wherein the differential amplifier comprises a bias element coupled between the main current streams and the control input of the controlled current source means; and the differential amplifier comprises degeneration elements included in the differential main current streams; and the controlled current source means comprises separately controlled current sources each coupled to a respective differential main current stream;

the differential amplifier comprises ripple supply voltage detecting means having a ripple control output coupled to the control input of the controlled current source means.

* * * * *